(12) United States Patent
Chenakin (10) Patent No.: US 7,701,299 B2
(45) Date of Patent: Apr. 20, 2010

(54) LOW PHASE NOISE PLL SYNTHESIZER

(75) Inventor: Oleksandr Chenakin, San Jose, CA (US)

(73) Assignee: Phase Matrix, Inc., San Jose, CA (US)

( * ) Notice: Subject to any disclaimer, the term of this patent is extended or adjusted under 35 U.S.C. 154(b) by 105 days.

(21) Appl. No.: 12/205,632

(22) Filed: Sep. 5, 2008

(65) Prior Publication Data
US 2009/0309665 A1 Dec. 17, 2009

Related U.S. Application Data

(60) Provisional application No. 61/129,265, filed on Jun. 16, 2008.

(51) Int. Cl.
*H03L 7/08* (2006.01)
(52) U.S. Cl. .............. 331/25; 331/37; 331/38
(58) Field of Classification Search ............ 331/25, 331/37, 38
See application file for complete search history.

(56) References Cited

U.S. PATENT DOCUMENTS

| | | | |
|---|---|---|---|
| 4,105,949 A | 8/1978 | Hardin | |
| 4,831,339 A * | 5/1989 | Nemeth | 331/25 |
| 4,890,071 A * | 12/1989 | Curtis | 331/11 |
| 5,508,661 A | 4/1996 | Keane et al. | |
| 5,625,324 A * | 4/1997 | Hsu et al. | 331/2 |
| 5,770,977 A | 6/1998 | Uurtamo | |
| 6,188,740 B1 | 2/2001 | Tomaru | |
| 6,282,249 B1 | 8/2001 | Tomesen et al. | |
| 6,373,344 B1 | 4/2002 | Mar | |
| 6,480,006 B1 | 11/2002 | Buckley | |
| 6,931,243 B2 | 8/2005 | Goldman | |
| 6,960,962 B2 * | 11/2005 | Peterzell et al. | 331/40 |
| 6,992,531 B2 | 1/2006 | Mar | |
| 7,012,453 B2 | 3/2006 | Coleman et al. | |
| 7,023,249 B1 | 4/2006 | Mulbrook | |
| 7,209,936 B2 | 4/2007 | Sullivan | |
| 7,321,268 B2 * | 1/2008 | Chang et al. | 331/37 |
| 7,386,286 B2 | 6/2008 | Petrovic et al. | |
| 2008/0136535 A1 | 6/2008 | Khorram | |
| 2008/0157881 A1 | 7/2008 | Dent et al. | |
| 2009/0309665 A1 * | 12/2009 | Chenakin | 331/25 |

OTHER PUBLICATIONS

A. Fox, "Ask the applications engineer—30, PLL Synthesizers", Analog Dialogue 36-03, 2002.
M. Curtin, P. O'Brien, "Phase locked loops for high frequency receivers and transmitters, Part 1", Analog Dialogue 33-3, 1999.
M. Curtin, P. O'Brien, "Phase locked loops for high frequency receivers and transmitters, Part 2", Analog Dialogue 33-5, 1999.
O. Chenakin, "Building a microwave frequency synthesizer—Part 1: Getting started", High Frequency Electronics, May 2008.

* cited by examiner

*Primary Examiner*—Joseph Chang
(74) *Attorney, Agent, or Firm*—NUPAT, LLC; Morrison Ulman (57) ABSTRACT

A low phase noise PLL synthesizer is described in which an initial tuning mechanism uses a conventional divider loop to lock a VCO to a desired output frequency. Once initial lock is achieved, the divider loop is switched out of the circuit in favor of a low phase noise mixer loop. The local oscillator signal for the mixer is derived from the same low phase noise source as the phase comparison frequency.

11 Claims, 8 Drawing Sheets

PRIOR ART

PRIOR ART

\# LOW PHASE NOISE PLL SYNTHESIZER

RELATED APPLICATIONS

This application claims priority benefit from U.S. Provisional Patent Application No. 61/129,265, "Method for low phase noise frequency synthesis", filed on Jun. 16, 2008.

TECHNICAL FIELD

The disclosure is related to the field of phase-locked loop (PLL) frequency synthesizers.

BACKGROUND

A phase-locked loop (PLL) synthesizer is an electronic system that translates an input reference-frequency signal to an output signal at a different frequency. Specifications such as output frequency range, step size, stability, tuning speed, and power characterize the breadth of a particular synthesizer design. Measurements of spectral purity such as harmonic and spurious signal suppression, and phase noise levels indicate how closely the synthesizer approaches ideal operation. Trade-offs exist between many different design parameters. As just one example, tuning speed, i.e. how fast the output frequency can be changed, may have to be sacrificed to reduce spurious signals.

Figure 1:
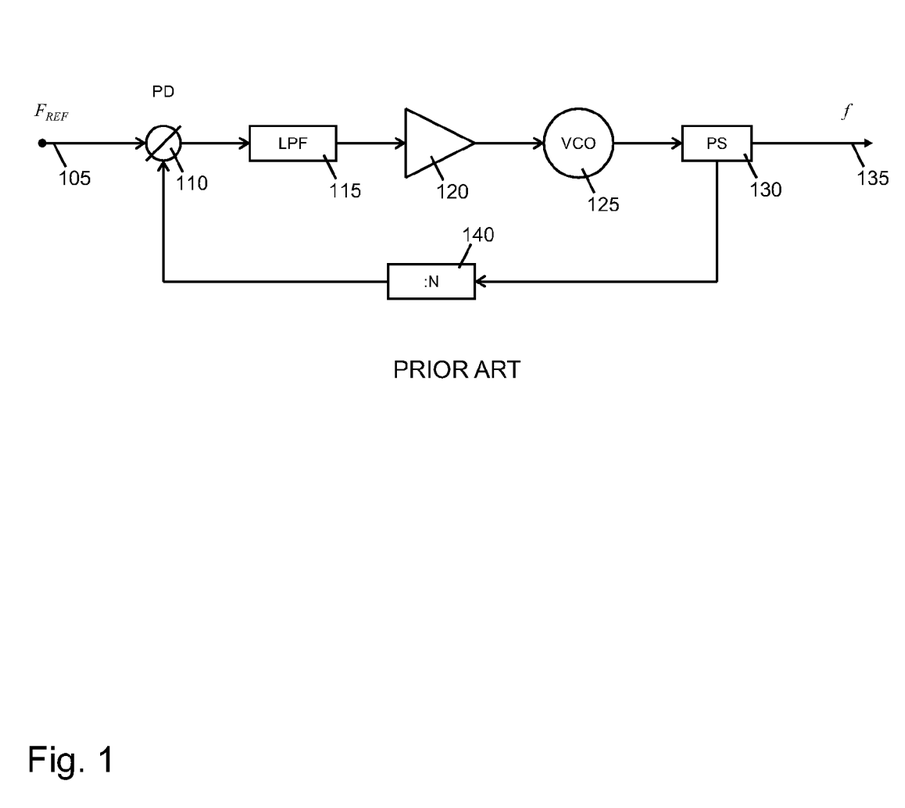
FIG. 1 is a simplified block diagram for a conventional PLL frequency synthesizer.

FIG. 1 is a simplified block diagram for a conventional PLL frequency synthesizer. The circuit is based on a voltage controlled oscillator (VCO) whose frequency output is locked in relation to a reference frequency by a feedback loop. In the figure, voltage controlled oscillator 125 generates an output signal 135 at frequency f. A portion of this signal is fed back to phase detector 110 via power splitter 130 and frequency divider 140. The frequency divider has a division ratio of N, meaning that its output frequency is N times less than its input frequency. The other input to the phase detector is a reference frequency signal 105 $F_{REF}$ which may be generated by a high-stability, fixed-frequency oscillator, for example. The phase detector compares the two signals at its inputs and generates an error signal which is then fed through low pass loop filter 115 and amplifier 120 before reaching the voltage controlled oscillator. (The phase detector, low pass filter, amplifier, VCO, power splitter and frequency divider therefore form a loop circuit.) The filtered and amplified error signal changes the frequency of the VCO until f is locked in relation to $F_{REF}$ by: $f=F_{REF} \times N$. If frequency divider 140 is programmable, as is often the case, the synthesizer can be programmed to generate any one of many frequencies within a range determined by the VCO. The step size between the possible output frequencies is equal to the reference frequency $F_{REF}$.

Phase noise is a manifestation of instability of the output frequency of a PLL synthesizer and is observed as random frequency fluctuations around the desired output frequency. It is a limiting factor in the sensitivity of radio frequency receivers. The level of phase noise near the desired carrier frequency depends on phase noise in the reference signal and on the PLL synthesizer circuit design.

Synthesizer phase noise within the loop filter bandwidth is given by $\lambda = \lambda_{PD} + 20 \log N$ where $\lambda_{PD}$ is the cumulative phase noise of the reference signal, phase detector, feedback divider, loop filter and amplifier referred to the phase detector input, and N is the division ratio of the frequency divider. In practice, the synthesizer phase noise performance is usually limited by large division ratios required to provide high-frequency output with fine resolution. For example, to obtain 1 MHz frequency resolution at 10 GHz output, the feedback divider ratio is 10,000, corresponding to 80 dB phase noise degradation.

At high frequencies an additional fixed divider (pre-scaler) may be needed as programmable dividers are often limited to lower frequency operation. This increases the total division ratio by the pre-scaler division ratio resulting in further phase noise degradation. (The amplitudes of spurious signals at multiples of the reference frequency also tend to be proportional to N.)

Figure 2:
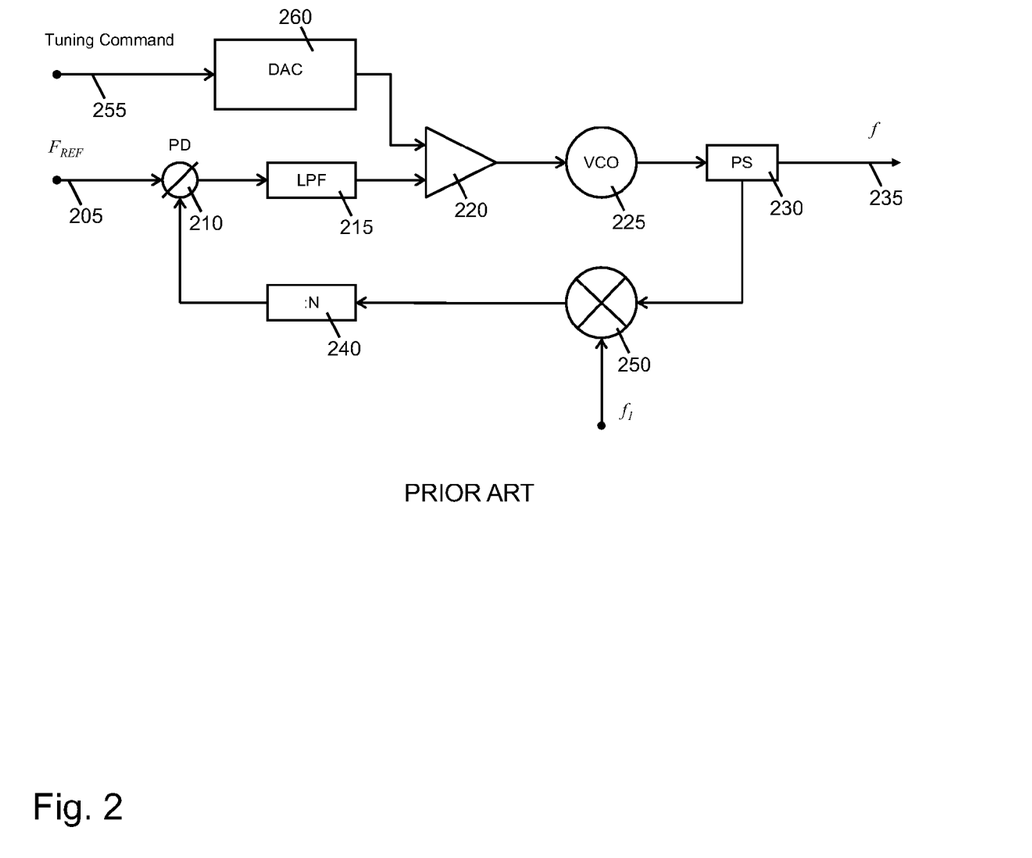
FIG. 2 is a simplified block diagram for a conventional PLL frequency synthesizer with frequency conversion in the synthesizer feedback path.

FIG. 2 is a simplified block diagram for a conventional PLL frequency synthesizer with frequency conversion in the synthesizer feedback loop. The circuit shown in FIG. 2 represents a conventional approach to phase noise reduction in PLL synthesizers based on reducing the frequency division ratio in the feedback loop. In the figure, voltage controlled oscillator (VCO) 225 generates an output signal 235 at frequency f. A portion of this signal is fed back to phase detector 210 via power splitter 230, mixer 250, and frequency divider 240. The other input to the phase detector is a reference frequency signal 205 $F_{REF}$ which may be generated by a high-stability, fixed-frequency oscillator, for example. A digital-to-analog converter (DAC) 260 is provided to translate digital tuning commands 255 for coarse tuning.

Mixer 250 reduces the maximum frequency division ratio by mixing the VCO output frequency with offset frequency $f_1$. Therefore, when the PLL synthesizer of FIG. 2 is locked, $f = f_1 \pm f_{REF} \times N$. Offset frequency $f_1$ may be obtained from another phase-locked loop or frequency multiplier.

Circuits of the type shown in FIG. 2 sometimes suffer from false lock to spurious mixer products. For example, the PLL might lock to the wrong sideband, harmonics, intermodulation products or leakage of the local oscillator. An accurate coarse-tuning mechanism is required to avoid false lock problems. In FIG. 2, DAC 260 tunes VCO 225 to approximately the correct frequency before the phase-locked loop locks. For such a coarse tuning system to work well, the tuning characteristics of the VCO must be linear and repeatable. Precise calibration is required to compensate for VCO temperature drift. DAC's are usually noisy and adversely affect synthesizer phase noise performance if they are not properly removed from the circuit after initial frequency acquisition.

Figure 3:
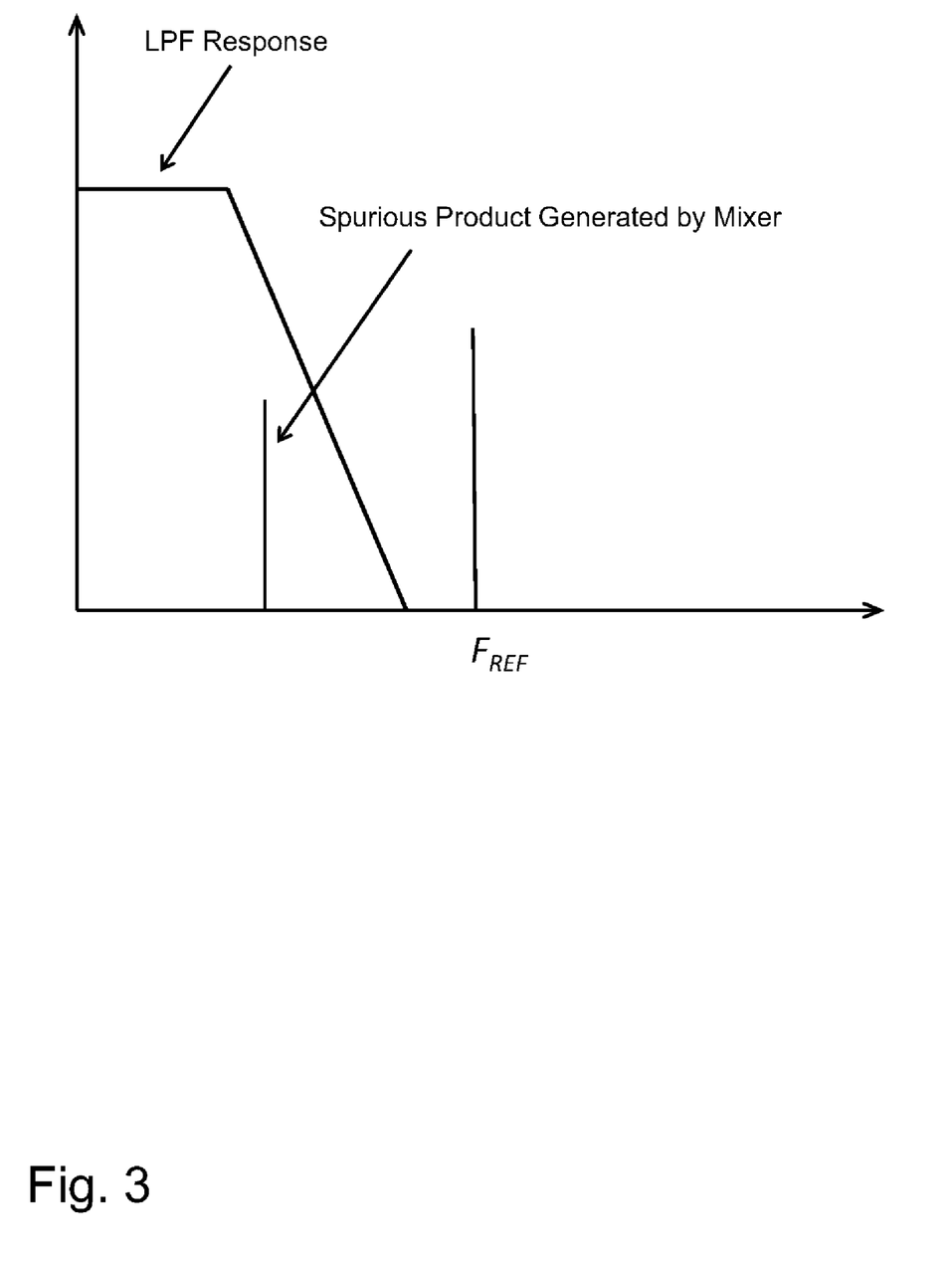
FIG. 3 is a graph showing how spurious signals can fall within the loop bandwidth of a conventional PLL.

Further, in the design of FIG. 2, mixer harmonic and intermodulation products can fall within the synthesizer loop bandwidth as shown in FIG. 3. FIG. 3 shows a spurious mixer product within the low pass filter response of the loop filter. Fractional-N and direct digital synthesis architectures can have similar problems with elevated spur levels.

What is needed is a PLL synthesizer capable of generating high frequency signals with low phase noise, low spurious emissions and fine frequency resolution.

BRIEF DESCRIPTION OF THE DRAWINGS

The drawings are schematic for clarity.

DETAILED DESCRIPTION

A new high frequency PLL synthesizer is now described. The design of the PLL synthesizer includes a simple, reliable and exact initial tuning mechanism which does not suffer from component instabilities. The synthesizer has good suppression of spurious signals because undesired mixer products fall outside the loop bandwidth. Low phase noise performance is achieved by removing frequency dividers from the synthesizer loop.

The initial tuning mechanism in the PLL synthesizer uses a conventional divider loop to lock a VCO to a desired output frequency. Once initial lock is achieved, the divider loop is switched out of the circuit in favor of a low phase noise mixer loop. The design of the mixer loop ensures that spurious signals fall outside the bandwidth of the PLL low pass filter and are therefore easily removed.

Figure 4A:
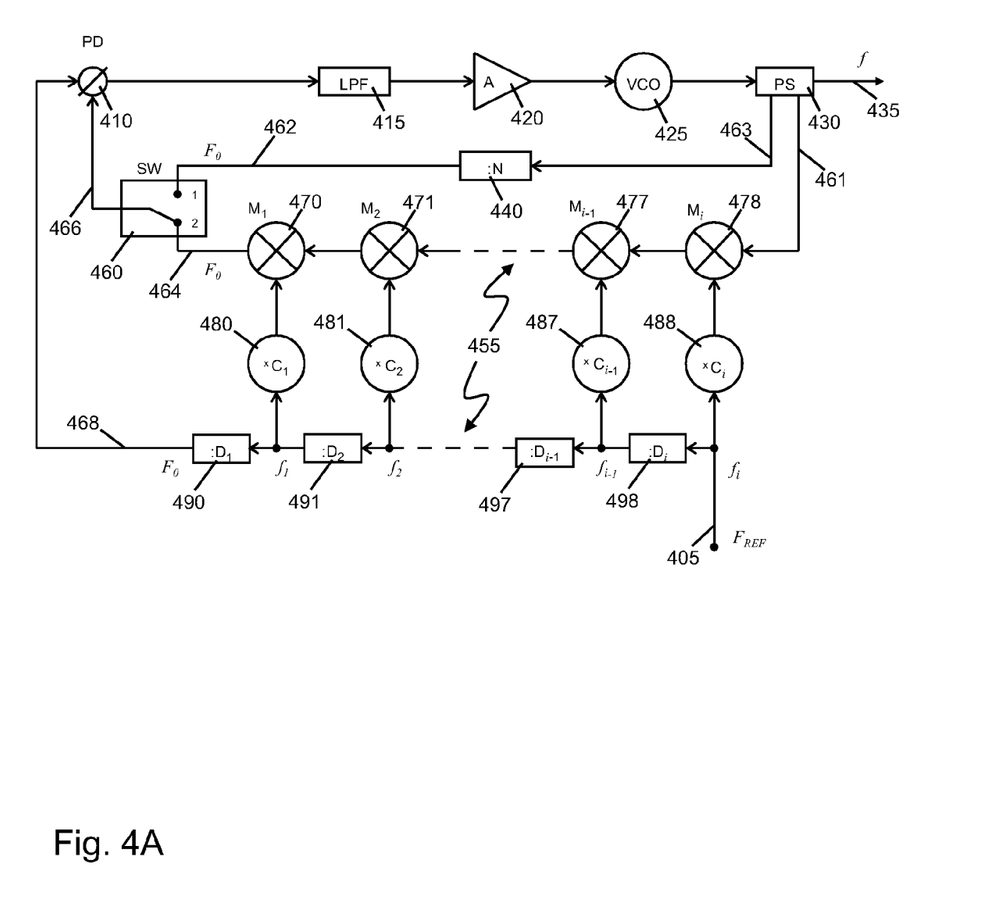
FIG. 4A is a simplified block diagram of a low phase noise PLL synthesizer.

FIG. 4A is a simplified block diagram of a low phase noise PLL synthesizer. The circuit is based on a VCO that is locked in relationship to a reference frequency by either of two feedback loops. One loop is used for initial tuning, while another provides low phase noise performance by removing all frequency dividers from the loop.

In the figure, an error signal generated by phase detector 410 is filtered by low-pass filter 415 and amplified by amplifier 420 before feeding voltage controlled oscillator (VCO) 425. A portion of the VCO output signal 435 is split off by power splitter 430 and returned to the phase detector after passing through either of two branches of a feedback loop selected by a switch.

Switch 460 selects either a conventional frequency divider loop similar to that shown in FIG. 1 or a frequency mixer system. A conventional loop comprising divider 440 is selected when switch 460 is in position "1" and is used for initial tuning. This loop includes components in the signal path between signals 463 and 462. A mixer system is selected when switch 460 is in position "2" and is used to achieve low phase noise operation. This loop includes components in the signal path between signals 461 and 464.

In FIG. 4A, the mixer system selected by position "2" of switch 460 is illustrated in generalized form. The mixer system comprises: mixers, such as mixers 470, 471, 477 and 478; frequency multipliers, such as multipliers 480, 481, 487 and 488; and frequency dividers, such as dividers 490, 491, 497 and 498. Each mixer has a corresponding multiplier and divider; however, the number of mixers used in a particular system may be one, two, several, or even as many as ten or more. For this reason, FIG. 4A shows mixers denoted $M_1$ through $M_i$ with corresponding multipliers $C_1$ through $C_i$ and dividers $D_1$ through $D_i$. Dotted lines 455 indicate that mixers with corresponding multipliers and dividers may be included in, or removed from, the circuit while maintaining the same architecture and principle of operation. The multipliers' multiplication factors ($C_1$ through $C_i$) and the dividers' division ratios ($D_1$ through $D_i$) are integers. The multipliers may be comb generators which output a large number of harmonics.

Reference frequency $F_{REF}$ 405 is a high-stability, low phase noise reference signal. $F_{REF}$ is divided by dividers $D_1$ through $D_i$ to form phase detector comparison signal 468 ($F_0$) which is one input to phase detector 410. The phase detector compares $F_0$ with signal 466. Note that dividers 490, 491, 497 and 498, providing division ratios ($D_1$ through $D_i$), are not in the PLL feedback loop and are not in the signal path between signals 461 and 464. When switch 460 is in position "2" the VCO slews to a lock frequency given by $f=F_0(D_1D_2 \ldots D_{i-1}D_iC_i\pm D_1D_2 \ldots D_{i-1}C_{i-1}\pm \ldots \pm D_1D_2C_2\pm D_1C_1\pm 1)$. Since all the division and multiplication coefficients are integers, $f=F_0\times N$, where $N=(D_1D_2 \ldots D_{i-1}D_iC_i\pm D_1D_2 \ldots D_{i-1}C_{i-1}\pm \ldots \pm D_1D_2C_2\pm D_1C_1\pm 1)$ is an integer.

Figure 5:
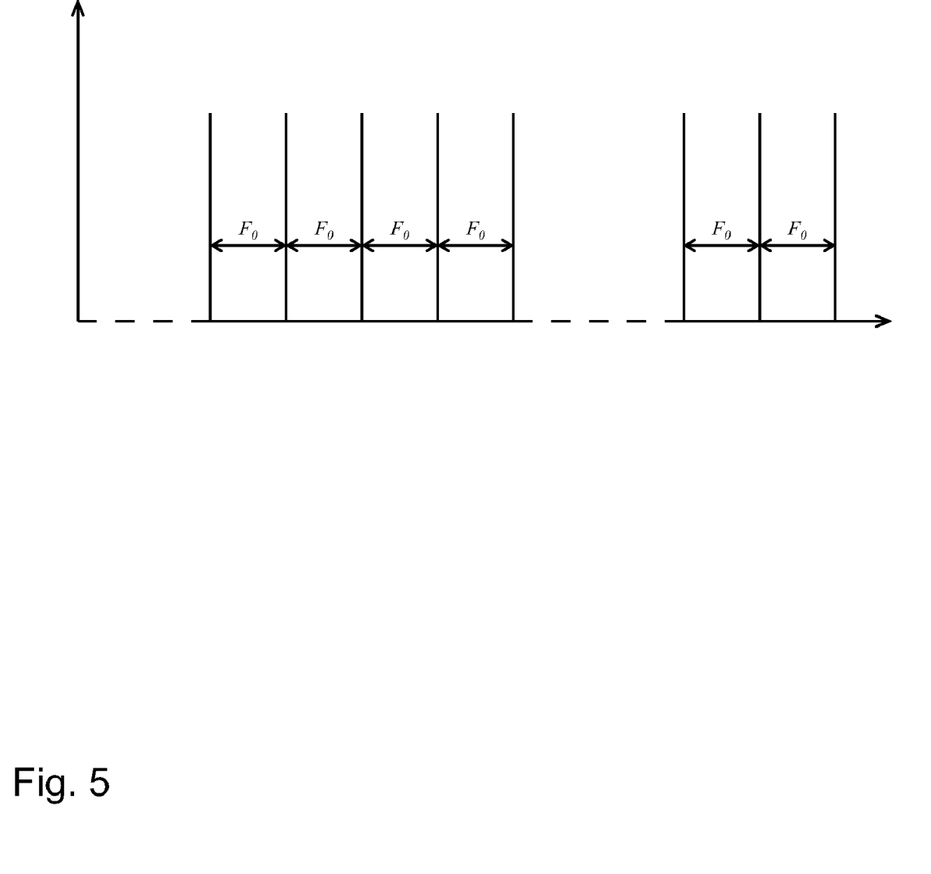
FIG. 5 is a graph showing the frequency output of a low phase noise PLL synthesizer.

Possible frequencies output by the synthesizer of FIG. 4A are equally spaced by $F_0$ as shown in FIG. 5. Switch 460 is set to position "1" to initially tune the synthesizer to one of the frequencies using a conventional divider feedback loop. A desired output frequency can be chosen exactly since divider 440 causes the feedback loop to lock to $f=F_0\times N$ where N is the division ratio of the divider and N may be chosen to exactly match an output of the mixer branch where $N=(D_1D_2 \ldots D_{i-1}D_iC_i\pm D_1D_2 \ldots D_{i-1}C_{i-1}\pm \ldots \pm D_1D_2C_2\pm D_1C_1\pm 1)$. This design minimizes the chance of false lock; i.e. locking the loop to an incorrect frequency.

Figure 6:
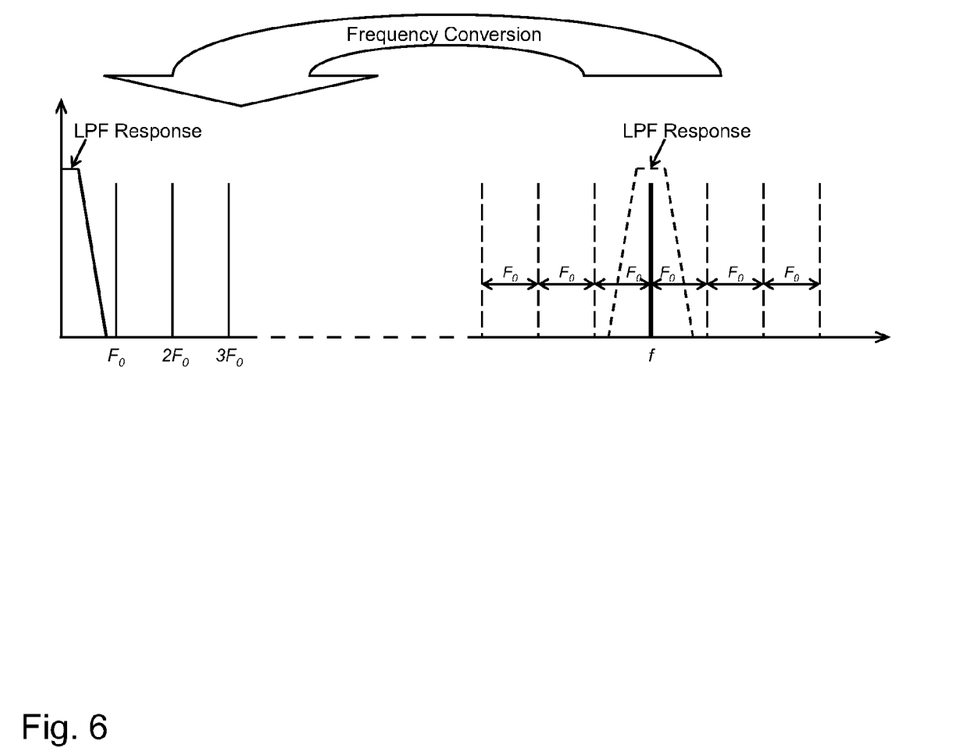
FIG. 6 is a graph showing how harmonic and intermodulation products of a low phase noise PLL synthesizer are rejected by a loop low-pass filter.

In the design of FIG. 4A, the mixer branch does not generate undesired signal products within the synthesizer loop bandwidth. The output of each mixer includes a large number of products including the mixer RF and LO fundamental frequencies, their harmonics, the sums and differences of the RF and LO frequencies, and their harmonics given by $f_{MIX}=\pm mf_{RF}\pm nf_{LO}$ which may be written as $f_{MIX\ i}=\pm mF_0N\pm nF_0D_1D_2 \ldots D_{i-1}D_iC_i$ for mixer $M_i$. Assuming that all the coefficients are integers, the mixer products can be expressed as $f_{MIX\ i}=k\ F_0$ where k is an integer. Similarly, all harmonic and intermodulation products generated by the mixer branch are multiples of the phase detector comparison frequency $F_0$. These products are easily rejected by a loop low-pass filter as shown in FIG. 6. The loop filter bandwidth is made small enough to reject undesired signals, typically ten times less than $F_0$. FIG. 6 illustrates the effect of the phase detector converting a loop feedback signal to near DC after mixing with a reference frequency. The output of the PLL is therefore a desired frequency, f within an effective band pass filter having a width narrower than $F_0$. This design ensures that spurious mixer products fall outside the loop filter bandwidth and are therefore easily removed.

Given a desired output frequency f and frequency resolution or step size $F_0$, the operation of the synthesizer proceeds as follows: Switch 460 is set to position "1" so that the initial-tuning divider branch is connected to, and the mixer branch is disconnected from, the phase detector. The divider ratio, N, of divider 440 is programmed to equal the ratio between the desired output frequency f and the step size $F_0$. The phase detector generates an error signal that tunes the VCO output to f. The phase detector also generates a lock-detect signal that switches switch 460 to position "2", thereby removing the divider branch from, and including the mixer branch in, the loop circuit. VCO output f is converted in the mixer branch to frequency $F_0$, the same frequency that was generated earlier in the divider branch. The phase detector relocks the output signal f; however, this time there is no frequency division in the feedback loop and phase noise is reduced. Loop low-pass filter 415 removes undesired mixer products thereby ensuring low spurious emissions.

Figure 4B:
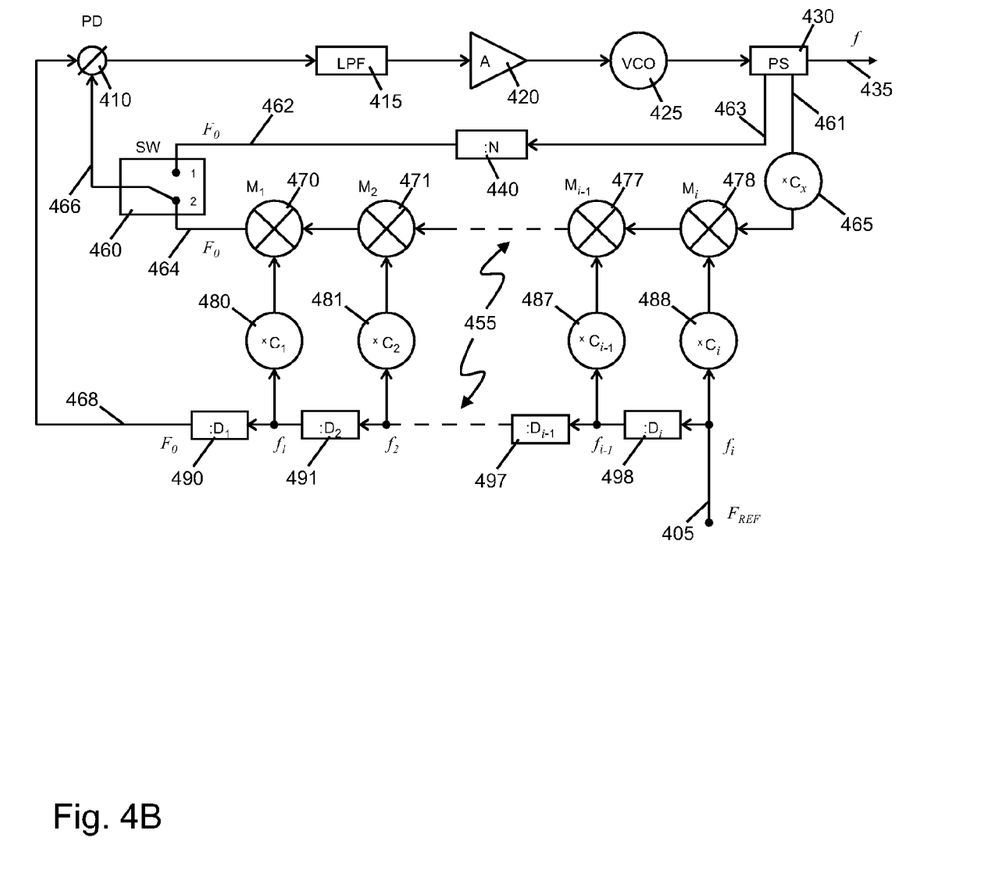
FIG. 4B is a simplified block diagram of a low phase noise PLL synthesizer including a multiplier in the loop feedback path.

FIG. 4B illustrates a variation of the synthesizer design of FIG. 4A. FIG. 4B is a simplified block diagram of a low phase noise PLL synthesizer including a multiplier in the loop feedback path. The synthesizer of FIG. 4B is identical to that of FIG. 4A except for the addition of multiplier 465, having multiplication factor $C_x$, in the feedback path between signals 461 and 464. Just as frequency division in the loop feedback path of a PLL synthesizer increases phase noise by 20 log N, frequency multiplication in the loop feedback path reduces phase noise by 20 log C, where C is the multiplication factor. Therefore a synthesizer designed according to FIG. 4B has 20 log $C_x$ lower phase noise than one having the design of FIG. 4A. A trade-off associated with multiplication in the loop feedback path is coarser frequency resolution; however, a desired frequency resolution may be achieved by including a sufficient number of mixers, $M_i$ (470-478).

Figure 7:
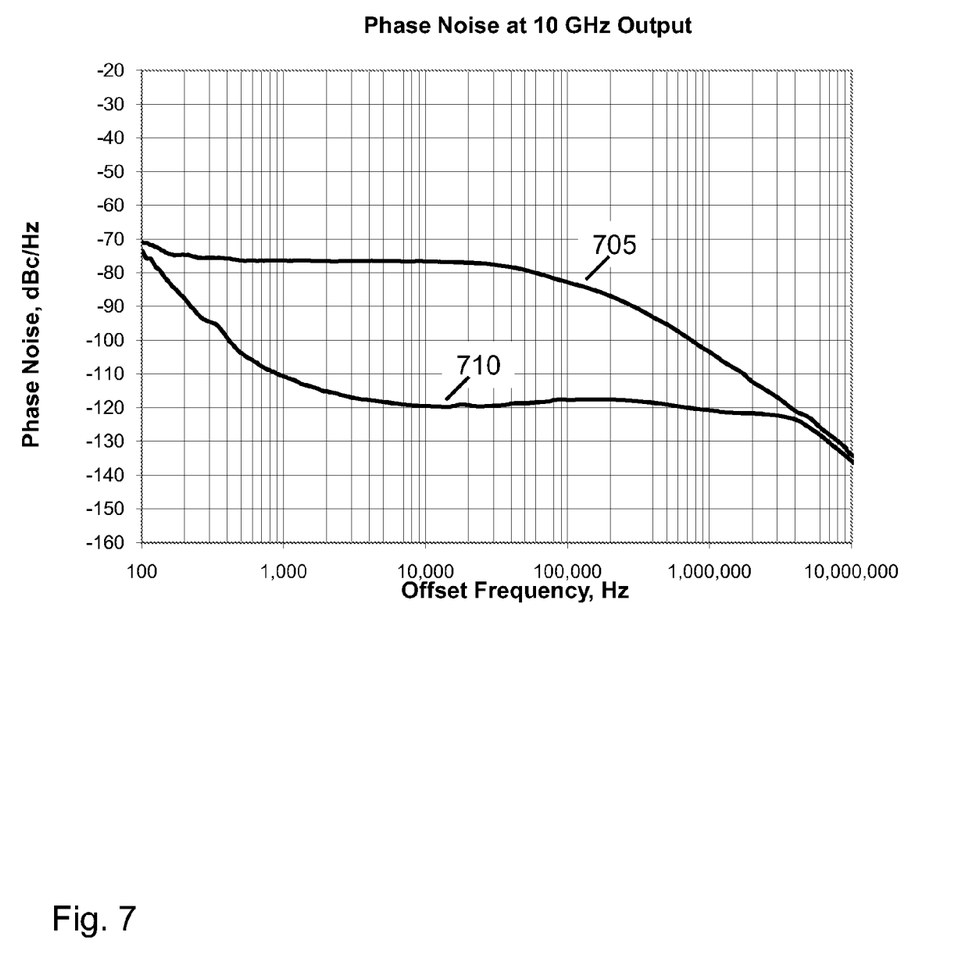
FIG. 7 is a graph of experimentally measured phase noise at 10 GHz carrier frequency for a conventional PLL synthesizer and one employing a low phase noise design.

FIG. 7 is a graph of experimentally measured phase noise at 10 GHz carrier frequency for a conventional PLL synthesizer and for a PLL synthesizer employing the low phase noise design of FIG. 4A. In FIG. 7 phase noise measured in dBc/Hz referenced to a 10 GHz carrier frequency is plotted versus frequency offset from the carrier. Plot 705 traces phase noise versus offset frequency for a conventional PLL synthesizer employing a large N divider in its feedback loop. Plot 710 traces phase noise for a PLL synthesizer of the design shown in FIG. 4A; i.e. one without frequency division in the feedback loop. It can be seen in the figure that at 10 kHz offset from the carrier, the synthesizer without feedback division has approximately 43 dB less phase noise. The specific results shown in FIG. 7 are illustrative only. However, a PLL synthesizer having the low phase noise design of FIG. 4A clearly generates less phase noise than a conventional design.

A low phase noise PLL synthesizer has been described in which an initial tuning mechanism in uses a conventional divider loop to lock a VCO to a desired output frequency. Once initial lock is achieved, the divider loop is switched out of the circuit in favor of a low phase noise mixer loop. The local oscillator signal for the mixer is derived from the same low phase noise source as the phase comparison frequency.

As one skilled in the art will readily appreciate from the disclosure of the embodiments herein, processes, machines, manufacture, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, means, methods, or steps.

The above description of illustrated embodiments of the systems and methods is not intended to be exhaustive or to limit the systems and methods to the precise form disclosed. While specific embodiments of, and examples for, the systems and methods are described herein for illustrative purposes, various equivalent modifications are possible within the scope of the systems and methods, as those skilled in the relevant art will recognize. The teachings of the systems and methods provided herein can be applied to other systems and methods, not only for the systems and methods described above.

In general, in the following claims, the terms used should not be construed to limit the systems and methods to the specific embodiments disclosed in the specification and the claims, but should be construed to include all systems that operate under the claims. Accordingly, the systems and methods are not limited by the disclosure, but instead the scope of the systems and methods are to be determined entirely by the claims.

What is claimed is:

1. A phase-locked loop frequency synthesizer comprising:
   a phase detector;
   a low pass filter connected to the phase detector;
   an amplifier connected to the low pass filter;
   a voltage controlled oscillator (VCO) connected to the amplifier;
   a power splitter connected to the VCO; and,
   a switch that selects either a first or a second branch that connects the power splitter to the phase detector;
   wherein,
      the first branch comprises a frequency divider; and,
      the second branch comprises a mixer.

2. The synthesizer of claim 1 wherein,
   the phase detector generates a lock detect signal that causes the switch to select the second branch after phase lock is achieved by the first branch.

3. The synthesizer of claim 1 wherein,
   the second branch does not include a frequency divider.

4. The synthesizer of claim 3 wherein,
   the second branch includes a frequency multiplier.

5. The synthesizer of claim 1 further comprising:
   a reference frequency source; and,
   a frequency divider that divides the output of the reference frequency source to generate a phase comparison signal for the phase detector.

6. The synthesizer of claim 5 further comprising:
   a frequency multiplier that multiplies the output of the reference frequency source to generate a local oscillator signal for the mixer.

7. The synthesizer of claim 6 wherein,
   the division ratio of the frequency divider (that divides the output of the reference frequency source) and the multiplication factor of the frequency multiplier (that multiplies the output of the reference frequency source) are integers.

8. The synthesizer of claim 7 wherein the integers are chosen such that,
   the frequency of the output of the second branch matches that of the output of the first branch.

9. The synthesizer of claim 7 further comprising:
   one or more additional mixers in the second branch.

10. The synthesizer of claim 8 further comprising:
    one or more additional multipliers that generate local oscillator signals for the one or more additional mixers.

11. A phase-locked loop frequency synthesizer comprising:
    a phase detector; a low pass filter; an amplifier; a voltage controlled oscillator (VCO);
    an initial tuning loop comprising a frequency divider; and,
    a mixer loop not including a frequency divider;
    wherein,
       the synthesizer switches between the initial tuning loop for frequency acquisition and the mixer loop for low phase noise performance; and,
       the initial loop and the mixer loop lock the synthesizer to the same frequency.

\* \* \* \* \*